United States Patent [19]

Kaneko et al.

[11] Patent Number: 4,647,869
[45] Date of Patent: Mar. 3, 1987

[54] MICROWAVE SOLID-STATE AMPLIFIER

[75] Inventors: Yoichi Kaneko, Tokorozawa; Kenji Sekine, Tokyo; Haruhiko Funaki, Tanashi, all of Japan

[73] Assignee: Hitachi, Ltd., Tokyo, Japan

[21] Appl. No.: 798,441

[22] Filed: Nov. 15, 1985

[30] Foreign Application Priority Data

Nov. 16, 1984 [JP] Japan .................................. 59-241726

[51] Int. Cl.⁴ ............................................... H03F 3/60
[52] U.S. Cl. ..................................... 330/286; 330/295; 333/230
[58] Field of Search .................... 330/53, 56, 286, 287, 330/295, 307; 333/137, 230, 227

[56] References Cited

FOREIGN PATENT DOCUMENTS 147011 11/1980 Japan ................................... 330/286
147212 9/1983 Japan ................................... 330/287

Primary Examiner—James B. Mullins
Attorney, Agent, or Firm—Antonelli, Terry & Wands

[57] ABSTRACT

Disclosed is a microwave solid-state amplifier arranged such that a plurality of amplifier units are used in combination of a radial cavity resonator so as to perform power dividing/combining, and that in order to make the microwave solid-state amplifier capable of performing a wide band operation and have less circuit loss, a coupling portion between the radial cavity resonator and each of the amplifier units is formed such that a loop-like conductor constituted by a stripline forming an input/output portion of the amplifier unit is removably inserted through a slot formed in a side wall surface of the cavity resonator.

2 Claims, 6 Drawing Figures

MICROWAVE SOLID-STATE AMPLIFIER

BACKGROUND OF THE INVENTION

The present invention generally relates to a microwave solid-state amplifier, and more particularly relates to an apparatus in which microwave signals in a range from 1 GHz to 50 GHz are amplified by a plurality of solid-state amplifier unit and then combined with each other or a single microwave signal is divided into a plurality of signals and then amplified by a plurality of solid-state amplifier units.

Conventionally, microwave amplifiers have been arranged such that amplifiers constituted by FETs (field effect transistors) are attached on a substrate and a microwave signal is passed through a plurality of amplifying stages so as to derive output power from the final power stage. In a microwave range, however, there is a limit in power derived from a single semiconductor device, and in order to obtain large power in a solid-state amplifier, therefore, there has been used such a device in which the output is added and increased through a power combiner. In this case, as a combiner in which a circuit loss is relatively small and which is suitable for large power, there has been used such a radial cavity power divider/combiner as shown in FIG. 5 (reference is made to IEEE MTT-S DIGEST, 1983 and MICROWAVE JOURNAL, 1984, January). The divider/combiner is constituted by a $T_{010}$ mode cavity resonator 52 and a $T_{020}$ mode cavity resonator 60 which are disposed vertically with the same center axis. The cavity resonator 52 is coupled with an external line through a coupling probe 53 and a coaxial connector 51, and the cavity resonator 60 is coupled with an external line through a plurality of circularly disposed connecting means constituted by a coupling loop 56 and a coaxial connector 58. The resonators 52 and 60 are coupled through a coupling probe 54 supported by a dielectric supporter 55. A tuning screw 57 is vertically movably disposed at a central portion. In order to realize a high output microwave amplifier by using such a radial cavity resonator as described above, two radial cavity resonators are prepared, one being used as a power divider and the other being used as a power combiner, and a plurality of amplifiers are disposed between the respective coaxial connectors 58 of the two radial cavity resonators.

In the above-mentioned conventional microwave solid-state amplifier, a disadvantage exists in that it is necessary to provide two radial cavity resonators and a plurality of amplifiers which are connected between the power divider and the power combiner through numbers of coaxial connectors, so that the number of terminals for power division and combination is limited by the size of the connectors at a higher frequency and the power loss due to the connectors is increased. That is, the size of the resonator is inverse to the frequency and therefore becomes smaller as the frequency becomes higher. For example, the adjustable size of the tuning screw 57 is predetermined and the size of each of the coaxial connectors 51 and 58 is determined depending on the size of the coaxial cable, so that if the resonator is reduced in size, the number of the attached terminals is limited correspondingly.

Generally, in a cavity resonator, the band width is narrower than 20 GHz at the most. Accordingly, in the resonator shown in FIG. 5, the $TM_{010}$ mode cavity resonator 52 and the $TM_{020}$ mode cavity resonator 60 are connected so as to make the band width wider through double tuning. If it is intended to widen the band width by double tuning, however, the structure becomes complicated.

SUMMARY OF THE INVENTION

It is an object of the present invention to eliminate the disadvantages in the prior art.

It is another object of the present invention to provide a microwave solid-state amplifier constituted by a power divider/combiner which is simple in structure, which is reduced in size, which has a less circuit loss, and which has a wide band width.

In order to attain the foregoing objects, according to the present invention, the microwave solid-state amplifier comprising, in combination, a plurality of microwave amplifier units and a radial power combiner/divider, is featured in that a plurality of slots are formed through a cylindrical wall of the above-mentioned radial power combiner/divider and loop-like input/output coupling means are inserted into the radial power combiner/divider through the slots, the input/output coupling means and the radial power combiner/divider being coupled with each other through a magnetic field.

In a particularly preferred embodiment, the above-mentioned microwave amplifier unit is constituted by a microwave integrated circuit (MIC), that is, constituted by an amplifier element coupled to a micro stripline on a substrate provided with a ground plane, and the above-mentioned loop-like input/output means is formed integrally with the micro stripline on the above-mentioned MIC plate.

In the microwave solid-state amplifier according to the present invention, no coaxial connector is required, because the coupling between the radial cavity resonator and the microwave amplifier units is realized by the insertion of the MIC plate. Accordingly, the arrangement can be reduced in size and can be made simple. Further, it is possible to reduce the circuit loss.

As will be described in detail later with respect to preferred embodiments of the present invention, the inductance of the coupling loop can be reduced so that the circuit loss can be reduced and a wide band characteristic can be obtained. Further, in the case where a microwave amplifier is constituted such that an input signal is divided, amplified by a plurality of microwave amplifier units, and then power combined, the number of resonators becomes a half in number in comparison with the case of employing the resonators of FIG. 5.

DESCRIPTION OF THE PREFERRED EMBODIMENTS

Figure 1:
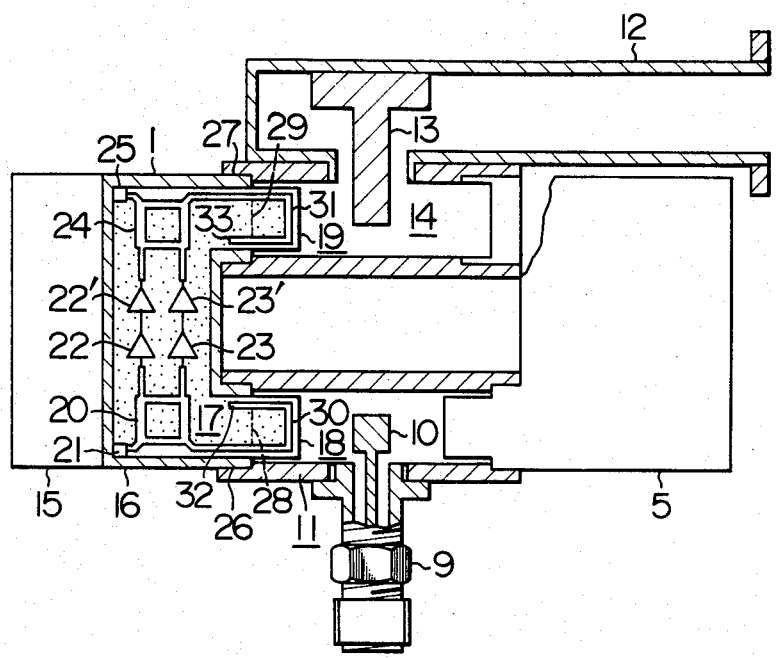
FIG. 1 is a cross-section of a microwave solid-state amplifier showing an embodiment according to the present invention.
Figure 2:
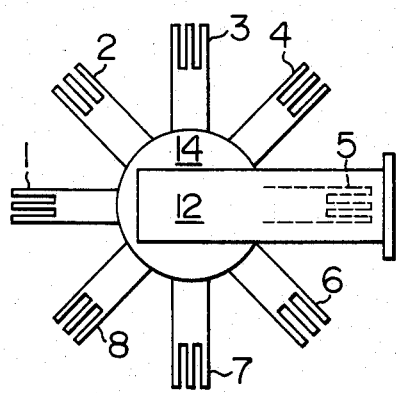
FIG. 2 is a top view of the same.

FIG. 1 is a cross-section of a microwave solid-state amplifier showing an embodiment according to the present invention and FIG. 2 is a top view of the same.

The microwave solid-state amplifier of this embodiment is constituted by a plurality of amplifier units 1, 2, . . . 8, a radial cavity power divider 11 having an input coaxial connector 9 and a coupling probe 10, and a radial cavity power combiner 14 having an output waveguide 12 and a coupling probe 13. As shown in FIG. 2, only the output waveguide 12, the power combiner 14 disposed under the former, the respective bodies of the seven amplifier units 1–4 and 6–8, and a radiator are exposed at the upper surface of the microwave solid state amplifier.

Figure 6:
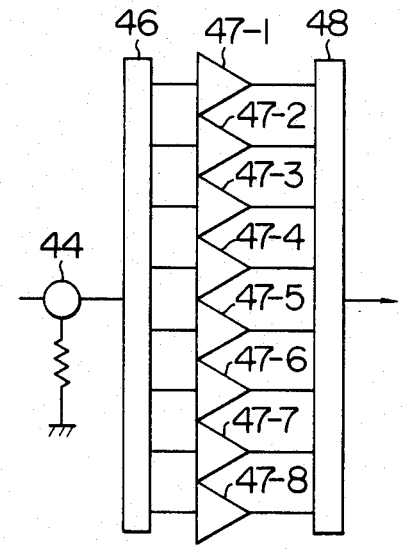
FIG. 6 is a block diagram for explaining power dividing/combining.

In FIG. 6 showing an operational block diagram of the whole of the microwave solid-state amplifier, an input signal 44 (corresponding to the coaxial connector 9 of FIG. 1) is divided by a power divider 46 (corresponding to the cavity power driver 11 and a connecting means 18 in FIG. 1) into eight divisional signals which are respectively power-amplified by eight amplifiers 47-1, 47-2, . . . 47-8 (corresponding to solid-state amplifier units 1, 2, . . . 8 of FIG. 1). The respective outputs of the amplifiers 47-1, 47-2, . . . 47-8 are combined by a power combiner 48 (corresponding to the cavity power combiner 14 and a connecting means 19 in FIG. 1).

FIG. 1 is a cross-section showing only the amplifier unit 1 of FIG. 2 and portions in the vicinity of the amplifier unit 1. In this embodiment of the solid-state amplifier employing a power divider/combiner suitable for a high frequency, a plurality of amplifier units is arranged such that an input/output coupling loop or connecting means 18 is provided on a substrate of a microwave integrated circuit (hereinafter abbreviated to MIC) and directly coupled with the power divider/combiner through a magnetic field so as to reduce the losses due to contact resistance as well as the restriction in the number of terminals which are peculiar to the conventional connectors and so as to minimize the inductance of the loop for the wide band operation, the minimized inductance being directly cancelled by reactance.

Particularly, each of the amplifier units 1 to 8 is arranged such that a MIC substrate 17 is received in a housing 16 provided with a radiator 15 and a projecting portion of the substrate 17 constitutes an input coupling portion 18 and an output coupling portion 19. The circuit of the amplifier is in the form of a balance type amplifier arranged such that an input signal is divided by a dividing hybrid circuit 20 and a matching load 21 into two divisional signals respectively applied to two amplifier systems 22, 22′ and 23, 23′, the respective amplified output signals from which are combined by a combining hybrid circuit 24 and a matching end 25, thereby reducing the reflection at the input and output terminals. The input coupling portion 18 and the output coupling portion 19 are inserted into the inside of the respective radial cavity resonators of the power divider 11 and the power combiner 14 through respective slots 26 and 27 formed in the walls of the cavity resonators, and micro stripline loops 30 and 31 are formed on the right sides of the respective lines of portions 28 and 29 where a ground plane of the substrate 17 is partially removed. The respective one ends of the micro stripline loops 30 and 31 are shorted or terminated with reactance by means of open stubs 32 and 33 of micro striplines. In such an arrangement, the loops 30 and 31 are respectively coupled with the magnetic fields, perpendicular to the paper plane of the drawing, of the respective $TM_{010}$ mode radial cavity resonators constituting the power divider 11 and the power combiner 14. The respective areas of the loops 30 and 31 determine the input and output impedance respectively which are selected to be a predetermined value, for example, 50 ohms. Generally, the respective optimum areas of the loops 30 and 31 become smaller as the respective numbers of divisions and combinations, that is, the number of amplifier units, become larger. In order to increase the degree of coupling, it is necessary not only to make larger the electromotive force due to microwave fields crossed by the loops 30 and 31 but also to make smaller to the utmost the self inductance of each of the loops 30 and 31 which impedes a current. In order to reduce the self inductance of each of the loops 30 and 31, generally, the width of the conductor of each loop is made large, however, there is a limitation in this way.

According to the present invention, the width of the loop conductor is not made wider but the respective self inductance of the loops 30 and 31 is cancelled by the respective capacitive reactance of the open stubs 32 and 33 formed at the respective one ends of the loops 30 and 31. That is, the respective series resonance circuits composed of the respective self inductance of the loops 30 and 31 and the respective capacitive reactance of the open stubs 32 and 33 are adjusted so as to obtain series resonance at a desired frequency to thereby eliminate a disadvantage of reduction in degree of coupling.

In the microwave solid-state amplifier shown in FIG. 1, the coupling portions can be made flat even nearly to the thickness of the MIC substrate 17 so that the number of division/combination can be increased extremely in comparison with the conventional one. Further, being directly connected with the respective cavity resonators, the loops 30 and 31 formed on the MIC substrate 17 are stable and low in loss in comparison with the conventional one, and therefore are suitable for high frequencies.

Figure 3:
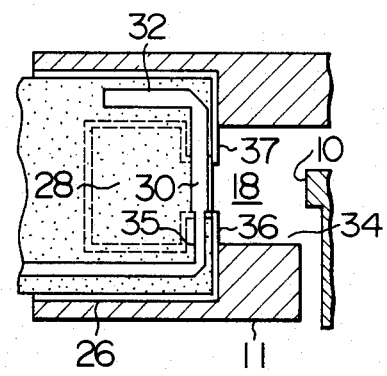
FIG. 3 is a cross-section of a coupling portion between a radial cavity resonator and an amplifier unit showing another embodiment of the present invention.

FIG. 3 is a cross-section of a coupling portion between a radial cavity resonator and an amplifier unit in another embodiment of the present invention.

In FIG. 3, an input coupling portion 18 is constituted by a shielded loop portion 35 and an open stub 32, the shielded loop portion 35 being constituted by a short loop 30 exposed to an electromagnetic field in a resonator 34 and a micro stripline shielded from the electromagnetic field in the resonator, the open stub 32 being constituted by a shielded micro stripline, thereby making it possible to widen the frequency band. A portion 28 of a MIC substrate where there is no ground plane is substantially the same in shape as the inner wall of the resonator 34 and the effective area of the loop is determined on the basis of the shape of one of the portions 28 and the inner wall having a smaller cross-section.

Annular protrusions 36 and 37 provided on the inner wall of the resonator 34 function to shield the shielded loop 35 and the open stub 32 from the electromagnetic field in the resonator to thereby further reduce the Joule loss generated on the ground plane of the micro stripline. The annular protrusions may be eliminated, however, if simplification is required.

Figure 4:
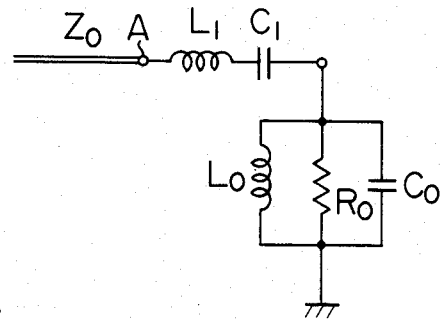
FIG. 4 is an equivalent circuit diagram showing an operation of an input/output coupling circuit of FIGS. 1 and 3.
Figure 5:
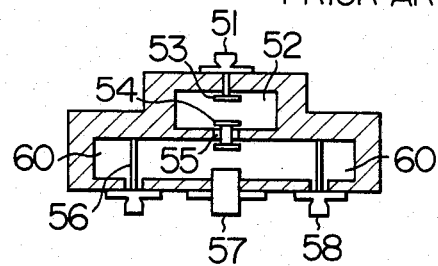
FIG. 5 is a cross-section showing the structure of the conventional radial cavity power divider/combiner.

FIG. 4 is an equivalent circuit diagram showing an operation of the input/output coupling circuit of FIGS. 1 and 3.

In FIGS. 1 and 3, when viewed from the input and output coupling portions 18 and 19, an equivalent circuit of the resonator to which a load is connected can be represented by a parallel resonance circuit of $L_o$, $R_o$, and $C_o$ as shown in FIG. 4. Further, the loop composed of the shielded loop portion 35 and the micro stripline open stub 32 can be represented by a serially connected inductance $L_1$ and capacitance $C_1$, and the frequency characteristic of the coupling portion can be made flat by selecting the inductance $L_1$ to an optimum value. $Z_o$ represents the characteristic impedance of the line connected to the respective input/output coupling portions 18 and 19. The circuit impedance Z, at an angular frequency in the vicinity of a resonance frequency, when viewed rightward from a point A when the self inductance of the loop is tuned with the serial capacitance, can be expressed as follows.

$$Z \approx j\omega_o L_1 \cdot 2\delta + R_o(1 - j2\delta Q_o) \quad (1)$$
$$\approx R_o + j(\omega_o L_1 - R_o Q_o) \cdot 2\delta$$

where $\omega_o = 2\pi f_o$ ($f_o$ being resonance frequency)

$$\delta = \frac{\omega - \omega_o}{\omega_o}$$

$$Q_o = R_o \omega_o C_o$$

In the equation (1), if $\omega_o L_1 = R_o Q_o$, then $Z = R_o$ so that it is possible to make the characteristic of the coupling circuit flat. It is necessary to select $\omega_o L_1$ to a relatively small value, for example, about 10 ohms.

The inductance $L_1$ and the capacitance $C_1$ are expressed as follows:

$$L_1 = \mu \cdot l \cdot \log \frac{b}{a} \quad (2)$$

$$C_1 = \frac{\epsilon S}{d} \quad (3)$$

where $\mu$ represents the permeability, $l$ the length of line, $b$ the dimension of outer circumference, $a$ the diameter in cross-section, $\epsilon$ the dielectric constant, S the area of line, and d the height. The respective values of the inductance $L_1$ and the capacitance $C_1$ can be properly selected.

The value of the capacitance $C_1$ does not appear in the equation (1) for obtaining the circuit impedance Z, because it is cancelled as follows. Now, if only the series circuit of the inductance $L_1$ and the capacitance $C_1$ is considered in FIG. 4, the composite impedance Z is expressed by the following equation.

$$Z = j\omega L_1 + \frac{1}{j\omega C_1} = j\omega L_1 \left(1 - \frac{1}{\omega^2 LC}\right) \quad (4)$$

$$= j\omega L_1 \left\{1 - \left(\frac{\omega_o}{\omega}\right)^2\right\}$$

where $$\omega_o^2 = \frac{1}{LC}$$

Accordingly, when $\omega = \omega_o$, $Z = 0$.

Next, as a second embodiment of the present invention, a case where the open stub 32 is eliminated in the structure of FIG. 3 will be discussed hereunder. That is, if the self inductance of the loop is selected to a value equal to or smaller than the above-mentioned value $L_1$, the open stub 32 may be eliminated and the upper end of the loop 18 is shorted to the ground plane to thereby simplify the arrangement. That is, if the value of the self inductance is small, the value of capacitance to cancel the self inductance becomes large and the impedance at a high frequency is regarded as short-circuiting, so that it becomes unnecessary to particularly provide the open stub 32 but it is sufficient to short the upper end of the loop 18 to the ground plane. In this case, the value of Q at the loop coupling portion becomes a sufficiently small value $Q_1$ as expressed by the following equation so that a wide band characteristic can be obtained.

$$Q_1 = \omega_0 L_1 / Z_o \quad (5)$$

Thus, in the structure of this embodiment, it is possible to make basically wide the band characteristic of the power divider/combiner by reducing the self inductance of the loop, and it is also possible to design the value of the self inductance freely independently of the loop area to make the characteristic flat. Further, since the length of the micro stripline exposed in the resonator is short, it is possible to reduce the conductor loss.

We claim:

1. A microwave solid-state amplifier comprising:
    a plurality of microwave integrated circuit (MIC) units each of which has a solid-state amplifier circuit and coupling means mounted on a MIC substrate, said coupling means being comprised of a stripline which traverses a portion where a ground plane of said MIC substrate is removed, one end of said stripline being connected to said solid-state amplifier circuit, and the other end of said stripline terminating at a position under which the ground plane of said MIC substrate is present; and
    at least one cylindrical cavity resonator formed with a plurality of slots in said wall surface of said resonator, said coupling means being inserted through said slots to obtain magnetic coupling.

2. A microwave solid-state amplifier comprising:
    two cylindrical cavity resonators having a plurality of slots in side walls of said resonators; and
    a plurality of microwave integrated circuits (MICs) each of which has a solid-state circuit, input coupling means and output coupling means formed on a MIC substrate, each of said input coupling means and said output coupling means being comprised of a stripline which traverses a portion where a ground plane of said MIC substrate is removed, one end of said stripline being connected to said solid-state amplifier circuit, and the other end of said stripline terminating at a position under which the ground plane of said MIC substrate is present, and said input coupling means being inserted through said slots of one of the two cylindrical cavity resonators and said output coupling means being inserted through said slots of the other one of said two cylindrical cavity resonators.

* * * * *